United States Patent
Sato et al.

(10) Patent No.: US 11,731,236 B2
(45) Date of Patent: Aug. 22, 2023

(54) METHOD FOR SELECTING TEMPLATE ASSEMBLY, METHOD FOR POLISHING WORKPIECE, AND TEMPLATE ASSEMBLY

(71) Applicant: SHIN-ETSU HANDOTAI CO., LTD., Tokyo (JP)

(72) Inventors: Kazuya Sato, Nasushiobara (JP); Naoki Kamihama, Nishigo-mura (JP); Hiromasa Hashimoto, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 1346 days.

(21) Appl. No.: 16/094,085

(22) PCT Filed: Mar. 14, 2017

(86) PCT No.: PCT/JP2017/010203
§ 371 (c)(1),
(2) Date: Oct. 16, 2018

(87) PCT Pub. No.: WO2017/195460
PCT Pub. Date: Nov. 16, 2017

(65) Prior Publication Data
US 2019/0126431 A1 May 2, 2019

(30) Foreign Application Priority Data
May 13, 2016 (JP) ................................. 2016-096794

(51) Int. Cl.
*B24B 37/32* (2012.01)
*G01B 11/30* (2006.01)
(Continued)

(52) U.S. Cl.
CPC .............. *B24B 37/32* (2013.01); *B24B 37/30* (2013.01); *G01B 11/02* (2013.01); *G01B 11/24* (2013.01);
(Continued)

(58) Field of Classification Search
None
See application file for complete search history.

(56) References Cited

U.S. PATENT DOCUMENTS

| | | | | |
|---|---|---|---|---|
| 5,101,602 A | * | 4/1992 | Hashimoto | ............. B24B 37/30 451/41 |
| 8,268,114 B2 | * | 9/2012 | Masumura | ............. B24B 37/30 451/388 |

(Continued)

FOREIGN PATENT DOCUMENTS

| JP | 2000296461 A | * | 10/2000 |
|---|---|---|---|
| JP | 2007-287787 A | | 11/2007 |

(Continued)

OTHER PUBLICATIONS

Comparing JIS A scale to Ra Surface Roughness scale found at http://rampinelli.eu/wp-content/uploads/2018/01/Roughness-Conversion-Chart-Rampinelli.pdf. Published 2018. (Year: 2018).*

(Continued)

*Primary Examiner* — Sylvia MacArthur
(74) *Attorney, Agent, or Firm* — Oliff PLC

(57) ABSTRACT

A method for selecting a template assembly includes: preparing a template assembly in which a template is concentrically attached on a base ring or a base plate having a larger outer diameter than the template, the template having a back pad to hold a workpiece back surface and a retainer ring positioned on the back pad and to hold an edge portion of the workpiece; non-destructively measuring a height position distribution of the retainer ring and the back pad on the (Continued)

template side of the template assembly, where an outer peripheral edge surface of the base ring or the base plate serves as a reference surface; calculating a flatness of the retainer ring and an average amount of step differences between the retainer ring and the back pad from the measured height position distribution; and selecting the template assembly based on the flatness and the average amount of step differences.

17 Claims, 8 Drawing Sheets

(51) Int. Cl.
*H01L 21/306* (2006.01)
*G01B 11/02* (2006.01)
*B24B 37/30* (2012.01)
*G01B 11/24* (2006.01)
*H01L 21/304* (2006.01)

(52) U.S. Cl.
CPC .......... *G01B 11/306* (2013.01); *H01L 21/304* (2013.01); *H01L 21/30625* (2013.01)

(56) References Cited

U.S. PATENT DOCUMENTS

| | | | | |
|---|---|---|---|---|
| 9,266,216 | B2* | 2/2016 | Masumura | ............ H01L 21/304 |
| 2007/0243796 | A1* | 10/2007 | Torii | ........................ B24B 37/32 |
| | | | | 451/41 |
| 2008/0299882 | A1* | 12/2008 | Ichinoshime | ........... B24B 37/32 |
| | | | | 451/398 |
| 2012/0289129 | A1* | 11/2012 | Hashimoto | ............. B24B 37/32 |
| | | | | 451/288 |
| 2013/0324012 | A1* | 12/2013 | Fukushima | ........... B24B 37/005 |
| | | | | 451/283 |
| 2014/0113531 | A1* | 4/2014 | Masumura | ............. B24B 37/32 |
| | | | | 451/288 |
| 2015/0273650 | A1* | 10/2015 | Namiki | ................. B24B 37/015 |
| | | | | 451/5 |
| 2016/0008947 | A1* | 1/2016 | Sato | ........................ B24B 37/30 |
| | | | | 156/303.1 |
| 2016/0101503 | A1* | 4/2016 | Hashimoto | ............. B24B 37/30 |
| | | | | 156/60 |
| 2019/0126431 | A1* | 5/2019 | Sato | ........................ G01B 11/24 |

FOREIGN PATENT DOCUMENTS

| | | | |
|---|---|---|---|
| JP | 2008302464 A | * | 12/2008 |
| JP | 2009-260142 A | | 11/2009 |
| JP | 2009260142 A | * | 11/2009 |
| JP | 2010-247254 A | | 11/2010 |
| JP | 2014-004675 A | | 1/2014 |
| JP | 2014-184511 A | | 10/2014 |
| JP | 2014-233815 A | | 12/2014 |
| JP | 2015-196211 A | | 11/2015 |
| JP | 2017-087328 A | | 5/2017 |
| KR | 20090124017 A | * | 12/2009 |
| WO | WO-0215247 A2 | * | 2/2002 ......... B24B 37/0056 |

OTHER PUBLICATIONS

Jun. 20, 2017 Search Report issued in International Patent Application No. PCT/JP2017/010203.

\* cited by examiner

FIG.2
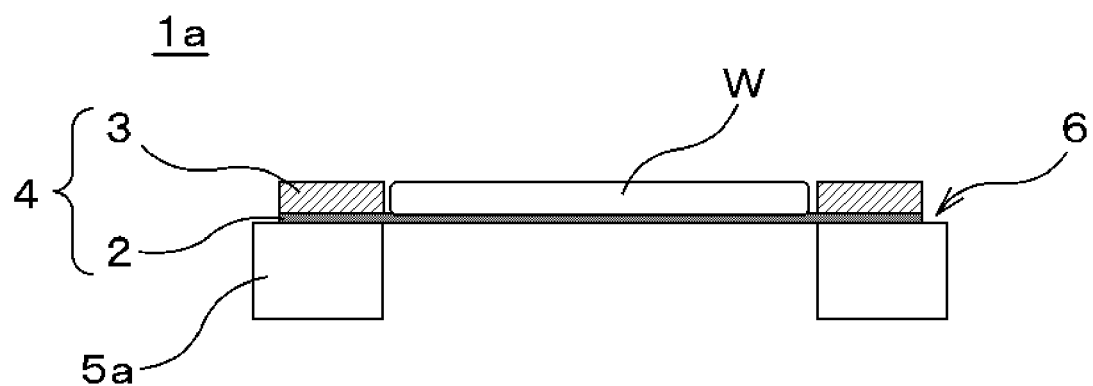
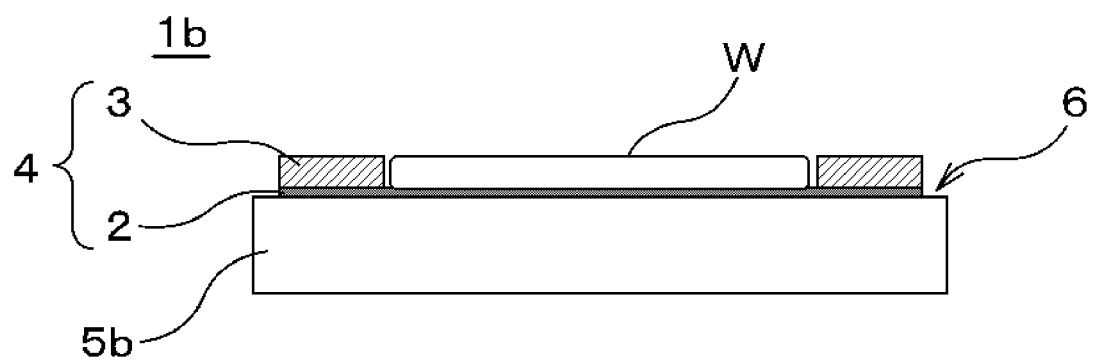

METHOD FOR SELECTING TEMPLATE ASSEMBLY, METHOD FOR POLISHING WORKPIECE, AND TEMPLATE ASSEMBLY

TECHNICAL FIELD

The present invention relates to a method for selecting a template assembly, a method for polishing a workpiece, and a template assembly.

BACKGROUND ART

In polishing workpieces such as silicon wafers, templates (TP) in each of which a retainer ring made of glass epoxy (GE) or the like is bonded to a backing pad (BP) are widely used as wafer holding jigs.

Such TP is normally used as a template assembly (TP ASSY) to which a base ring or base plate made of a material such as Ti, PVC, or ceramic is attached.

Normally, the retainer ring is designed to have an inner diameter slightly larger than the diameter of a workpiece and an outer diameter smaller than the outer diameter of the base ring or base plate. Generally, multiple polishing heads as many as 4 to 12 are attached to a polishing machine, and template assemblies are respectively mounted on the polishing heads.

CITATION LIST

Patent Literature

Patent Literature 1: Japanese Patent Application No. 2015-218440
Patent Literature 2: Japanese Unexamined Patent Application Publication No. 2014-004675
Patent Literature 3: Japanese Unexamined Patent Application Publication No. 2014-233815
Patent Literature 4: Japanese Unexamined Patent Application Publication No. 2007-287787

DISCLOSURE OF INVENTION

Problem to be Solved by the Invention

In this respect, a problem arises that even when template assemblies prepared from templates produced in the same lot are used, the flatness of polished workpieces varies among the polishing heads.

As the countermeasure, an improvement has been achieved to some extent by making polishing heads have a common level step difference between each retainer ring and BP, that is, pocket depth (P.D.). Nevertheless, as the demand for the tight flatness requirement is increased, controlling the pocket depth alone is not sufficient.

The present inventors have conducted studies and come to find that, besides P.D., the flatness of a retainer ring influences the flatness variation among polishing heads.

Here, as the method for measuring the flatness of a retainer ring, a method for measuring multiple lines with a probe-type displacement gauge has been conventionally adopted. However, in this measurement method, positioning of specimens, vertical movements of the probe, and so forth are carried out manually, so that a lot of man-hour is required, and information on circumferential direction is insufficient. Moreover, due to the contact-type approach, the surface of a retainer ring is consequently scratched.

Meanwhile, there is a method as in Patent Literature 1 in which an in-line type, non-contact laser displacement gauge is linked with a polishing head to measure a pocket depth in a circumferential direction. This method is further developed. Nonetheless, in the measurement precision determination, since the laser scanning width is normally several mm, a single measurement cannot cover the distance of generally several tens of mm from the outer circumference of a base ring to the inner circumferential edge of a retainer ring.

On the other hand, admittedly commercial products include a laser displacement gauge capable of covering such a distance. It is known that the wider the range, the more the measurement precision deteriorates particularly at both ends of the measurement width. Further, it has also been known that a template assembly to be measured has two step differences (between a base and a retainer ring, and between the retainer ring and a back pad), and if a portion corresponding to the step difference is not located immediately below laser light, the corner of the step difference acts like a shadow and accurate reflection light cannot be obtained, so that particularly the measurement precision of a pocket depth deteriorates.

Incidentally, in the prior art search, Patent Literature 1 describes a method for measuring a pocket depth of a template. Meanwhile, Patent Literature 2 discloses that the height of a retainer ring is measured in a non-contact manner with a laser displacement gauge. Patent Literature 3 discloses that the flatness of the template surface and the backing pad surface is measured with a laser displacement gauge. Patent Literature 4 discloses that the thickness and the height of a retainer ring are measured with a laser displacement gauge. Nevertheless, no prior art has been found in which the flatness and the P.D. of a retainer ring are measured in order to select a template assembly.

The present invention has been made in view of the problems as described above. An object of the present invention is to provide a method for selecting a template assembly, which enables adjustment of a flatness variation of polished workpieces.

Means for Solving Problem

To achieve the object, the present invention provides a method for selecting a template assembly to be mounted on a polishing head and used to hold a workpiece when a surface of the workpiece is polished by being slidably contacted to against a polishing pad attached on a turntable, the method comprising:

a preparation step of preparing a template assembly in which a template is concentrically attached on a base ring or a base plate having a larger outer diameter than that of the template, wherein the template has a back pad configured to hold a back surface of the workpiece and a retainer ring positioned on the back pad and configured to hold an edge portion of the workpiece;

a measurement step of non-destructively measuring a height position distribution of the retainer ring and the back pad on the template side of the template assembly, where an outer peripheral edge surface of the base ring or the base plate serves as a reference surface;

a calculation step of calculating a flatness of the retainer ring and an average amount of step differences between the retainer ring and the back pad from the measured height position distribution; and a selection step of selecting the template assembly based on the flatness and the average amount of step differences.

Accordingly, in addition to the average amount of step differences between the retainer ring and the back pad, the flatness of the retainer ring can be measured before the mounting onto the polishing head. Then, the template assembly can be selected based on the flatness and the average amount of step differences. Thus, when such template assemblies selected as described above are used to polish workpieces, this makes it possible to adjust a flatness variation of polished workpieces. Particularly, it is possible to prevent the flatness variation. Further, performing the measurement step non-destructively makes it possible to prevent scratch on the retainer ring surface. Hence, dust generation can be prevented, and the polished workpiece can also be prevented from scratch.

In this event, the base ring or the base plate used preferably has
a larger outer diameter by at least 10 mm than that of the template and
a surface roughness being Ra≤6.3 μm.

This makes it possible to prevent an error in a result of leveling a profile based on the outer peripheral edge surface, when the measurement result is subjected to data processing. Thus, the aforementioned flatness and so on can be obtained more accurately, and consequently proper selection is possible.

In this event, it is more preferable that in the measurement step, measuring the height position distribution for each circumference of the template assembly by laser scanning in the circumferential direction using a laser displacement gauge and sliding the laser displacement gauge in a radial direction of the template assembly be alternately performed to measure the height position distribution of the retainer ring and the back pad at once.

Accordingly, the height position distribution can be measured at once. Consequently, the flatness of the retainer ring and the average amount of step differences between the retainer ring and the back pad can be non-destructively calculated at once in the circumferential directions with high precision and high throughput.

In this event, it is further preferable that:
a plurality of the template assemblies be prepared in the preparation step,
the measurement step and the calculation step be performed for each of the template assemblies, and
from the plurality of template assemblies, template assemblies be selected which differ from each other in the flatness by 5 μm or less and differ from each other in the average amount of step differences by 5 μm or less.

This makes it possible to select template assemblies which have sufficiently small variations in the flatness and the average amount of step differences from a plurality of template assemblies. Thus, when such template assemblies selected as described above are used to polish workpieces, it is possible to more surely prevent a flatness variation of the polished workpieces.

In addition, the present invention provides a method for polishing a workpiece, comprising mounting the template assembly selected by the inventive method for selecting a template assembly as described above on the polishing head to hold the workpiece for polishing.

Since workpieces are polished using the template assembly selected by the inventive method for selecting a template assembly as described above, it is possible to prevent a flatness variation of the polished workpieces.

Moreover, the present invention provides a template assembly to be mounted on a polishing head and used to hold a workpiece when a surface of the workpiece is polished by being slidably contacted to against a polishing pad attached on a turntable, the template assembly comprising:
a template having
a back pad configured to hold a back surface of the workpiece and
a retainer ring positioned on the back pad and configured to hold an edge portion of the workpiece; and
a base ring or a base plate having a larger outer diameter than that of the template, wherein
the template is concentrically attached on the base ring or the base plate, and
the base ring or the base plate has
a larger outer diameter by at least 10 mm than that of the template and
a surface roughness being Ra≤6.3 μm.

Such a template assembly prevents an error in a result of leveling a profile, where the outer peripheral edge of the base ring or the base plate serves as a reference surface, so that the flatness and so on are obtained more accurately. Thus, it is also possible to select template assembly based on the accurate flatness and so on, and to prevent a flatness variation of polished workpieces.

Effects of the Invention

According to the inventive method for selecting a template assembly, it is possible to measure the flatness of the retainer ring in addition to the average amount of step differences between the retainer ring and the back pad before the mounting onto the polishing head. Then, the template assembly can be selected based on the flatness and the average amount of step differences. Thus, when workpieces are polished using template assemblies selected as described above, it is possible to particularly prevent a flatness variation of the polished workpieces. Further, the non-destructive measurements of the above-described values make it possible to prevent the retainer ring surface from scratch. As a result, dust generation can be prevented, and the polished workpiece can also be prevented from scratch.

BRIEF DESCRIPTION OF DRAWINGS

FIG. 2 is a schematic view showing an example of the inventive template assemblies;

BEST MODES FOR CARRYING OUT THE INVENTION

Figure 1:
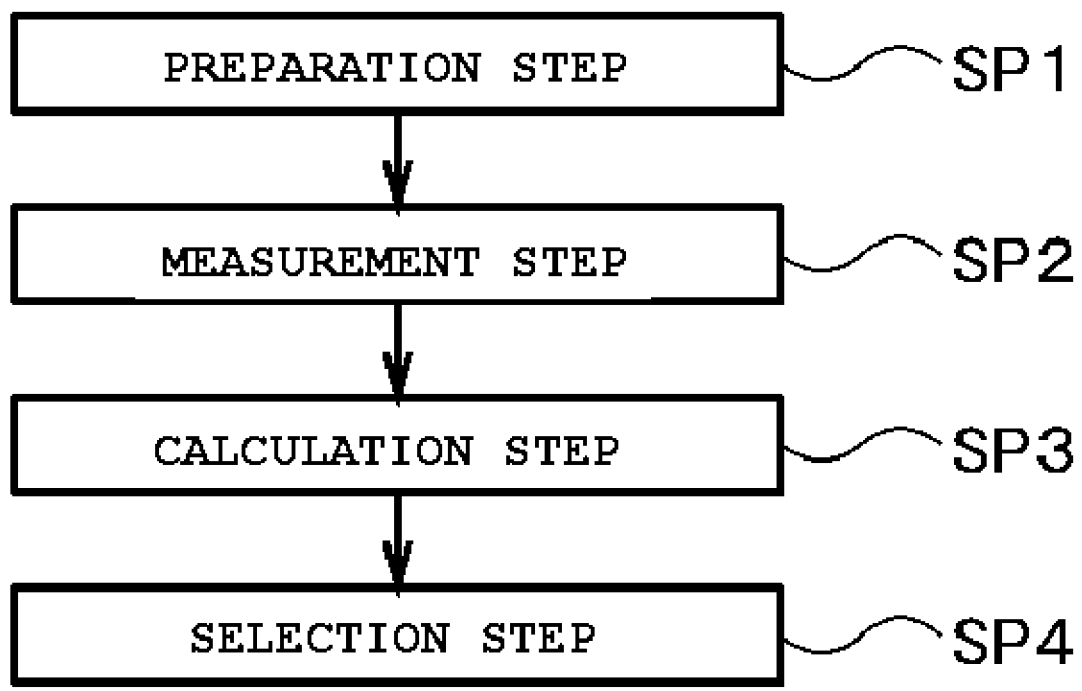
FIG. 1 is a process chart for illustrating an example of the inventive method for selecting a template assembly.

Hereinafter, embodiments of the present invention will be described, but the present invention is not limited thereto.

As described above, making polishing heads have the same degree of pocket depths in template assemblies alone cannot sufficiently adjust a flatness variation of polished workpieces.

Hence, the present inventors have conducted earnest studies to solve such a problem. Consequently, the inventors have found that, besides pocket depth, the flatness of a retainer ring influences a flatness variation among polishing heads. Then, the inventors have completed the present invention by considering that the flatness of a retainer ring is measured in addition to an average amount of step differences between the retainer ring and a back pad before mounting onto a polishing head, and a template assembly selected based on the flatness and the average amount of step differences is used to polish a workpiece; consequently, a flatness variation of polished workpieces can be adjusted, and particularly it is possible to prevent the generation of the flatness variation. Further, the inventors has carefully examined the best mode to carry out these and completed the present invention.

First, the inventive template assembly will be described. FIG. 2 is a schematic view showing an example of the inventive template assemblies. Note that a workpiece W is also shown in FIG. 2 to explain the positional relation.

As shown in FIG. 2, a template assembly 1a or a template assembly 1b of the present invention includes: a template 4 having a back pad 2 configured to hold a back surface of the workpiece W and a retainer ring 3 positioned on the back pad 2 and configured to hold an edge portion of the workpiece W; and a base ring 5a or a base plate 5b having a larger outer diameter than that of the template 4.

Additionally, the template 4 is concentrically attached on the base ring 5a or the base plate 5b. The outer diameter of the base ring 5a or the base plate 5b is larger than the outer diameter of the template 4 by at least 10 mm. The surface roughness of the base ring 5a or the base plate 5b satisfies $Ra \leq 6.3$ μm.

With such a structure, the flatness and so on of the retainer ring can be obtained more accurately than ever. This can lead to prevention of a flatness variation of polished workpieces consequently.

Next, a method for selecting a template assembly of the present invention will be described. FIG. 1 is a process chart for illustrating an example of the inventive method for selecting a template assembly.

First, a preparation step is performed (SP1 in FIG. 1). Specifically, the template assembly 1a or the template assembly 1b as shown in FIG. 2 is prepared in which the template 4 is concentrically attached on the base ring 5a or the base plate 5b having a larger outer diameter than that of the template 4. The template 4 has the back pad 2 which holds the back surface of the workpiece W, and the retainer ring 3 which is positioned on the back pad 2 and holds the edge portion of the workpiece W.

For example, given that the workpiece W has a diameter of 300 mm, the retainer ring 3 can be designed to have an inner diameter of normally 300.5 to 303 mm and an outer diameter of 320 to 400 mm.

Moreover, it is preferable to use the base ring 5a or the base plate 5b having an outer diameter larger than the outer diameter of the template 4 by at least 10 mm and a surface roughness being $Ra \leq 6.3$ μm. In this case, the surface roughness can be $Ra \geq 0$ μm. Accordingly, when the measurement result obtained in a measurement step to be described later is subjected to data processing, it is possible to prevent the generation of an error in a result of leveling a profile based on the outer peripheral edge surface.

Alternatively, the base ring 5a or the base plate 5b can be designed to have an outer diameter further larger by 20 to 50 mm than that of the retainer ring 3. When the base ring 5a is used, the inner diameter of the base ring 5a can be set freely in accordance with desired polishing properties.

Next, a measurement step is performed in which a height position distribution of the retainer ring 3 and the back pad 2 on the template 4 side of the template assembly 1a or the template assembly 1b is non-destructively measured, where an outer peripheral edge surface 6 of the base ring 5a or the base plate 5b serves as a reference surface (SP2 in FIG. 1).

Figure 3:
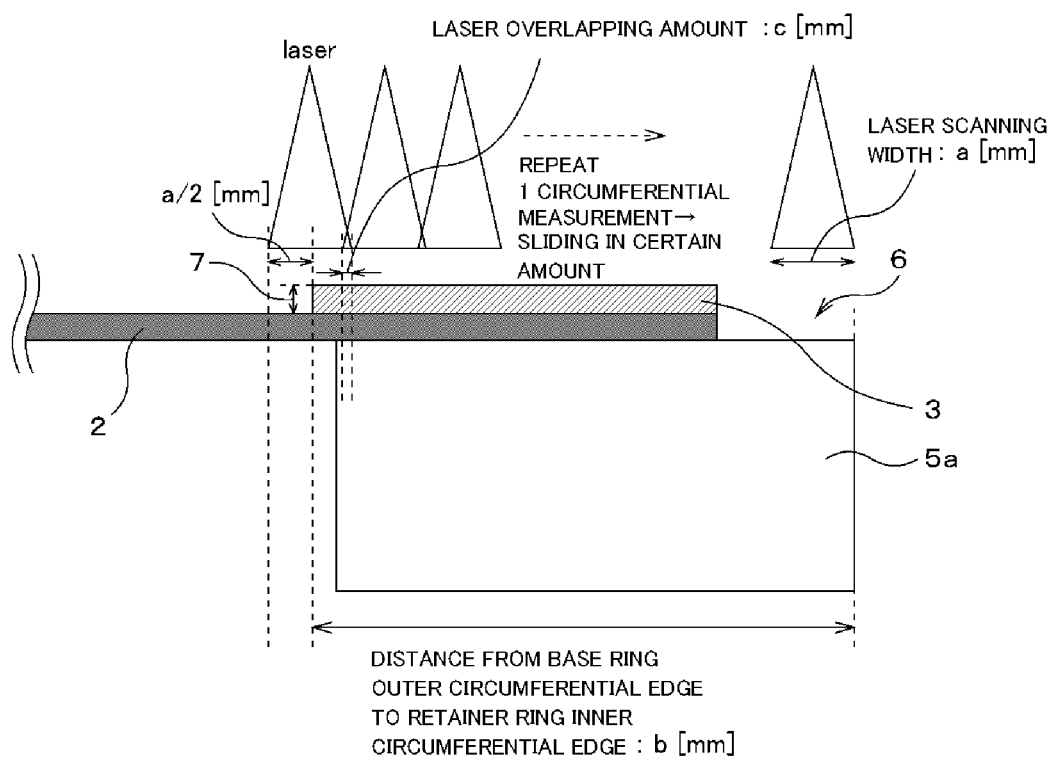
FIG. 3 is a schematic view for illustrating an example of a measurement step in the inventive method for selecting a template assembly.

An example of the non-destructive measurement method in this event includes a method using a laser displacement gauge as shown in FIG. 3. Preferably, measuring the height position distribution for each circumference of the template assembly by laser scanning in the circumferential direction and sliding in a radial direction of the template assembly are alternately performed to measure the height position distribution of the retainer ring 3 and the back pad 2 at once.

Accordingly, the flatness of the retainer ring 3 and the average amount of step differences (i.e., pocket depth 7) between the retainer ring 3 and the back pad 2 can be non-destructively measured at once in the circumferential directions with high precision and high throughput.

Figure 4:
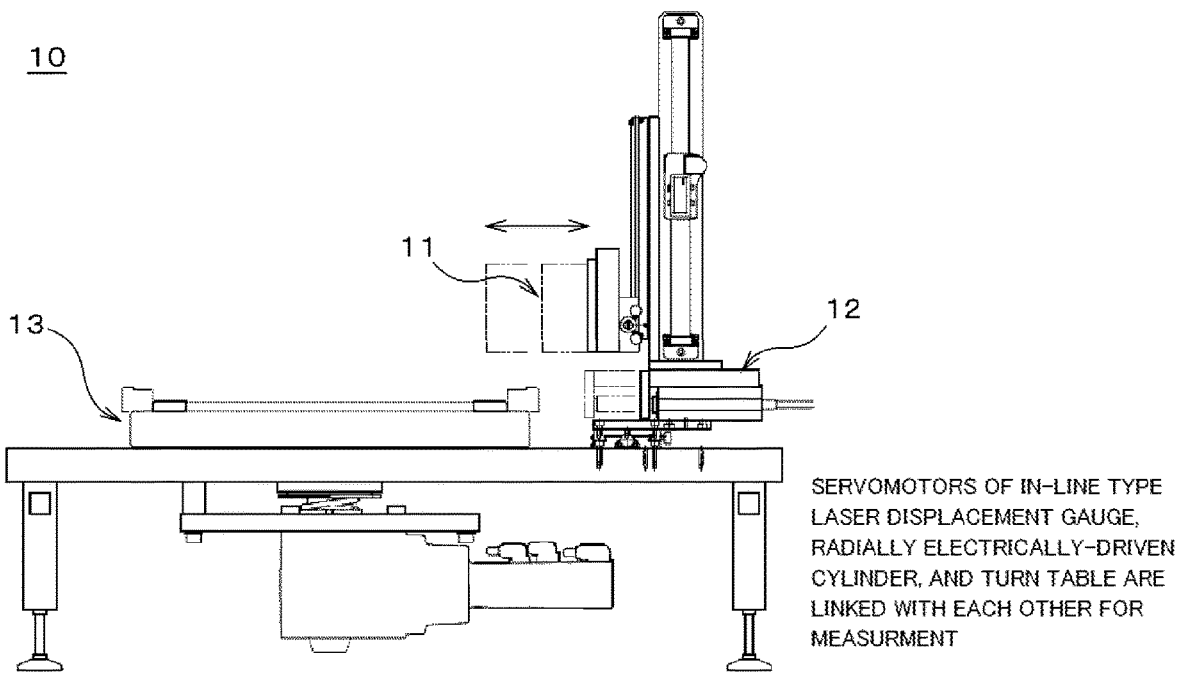
FIG. 4 is a schematic view showing an example of a measurement unit usable in the measurement step in the inventive method for selecting a template assembly.

In this event, more specifically, the measurement step can be performed using a measurement unit 10 as shown in FIG. 4, for example. In the measurement unit 10, a non-contact laser displacement gauge 11 is arranged on a cylinder 12 which has a movable region in the radial direction of a template assembly, and a turn table 13 on which the template assembly is precisely mountable can be arranged in such a manner that the retainer ring part comes immediately below the non-contact laser displacement gauge 11.

Here, as the non-contact laser displacement gauge 11, a high-precision type such as, for example, LJ-V7020 manufactured by KEYENCE Corporation is usable. This non-contact laser displacement gauge has a laser width of 6 to 8 mm. Meanwhile, the template assembly to be measured in the present invention has a width of, for example, 40 mm from an outer circumferential edge of the base ring or the base plate to an inner circumferential edge of the retainer ring.

Hence, when a laser displacement gauge having such a laser width as described above is used, the entire range cannot be measured in a single measurement. For this reason, the sampling period of the non-contact laser displacement gauge 11 is synchronized with encoder outputs from the rotation in the circumferential direction of the template assembly by the turn table 13 and the relative movement in the radial direction of the template assembly by the cylinder 12, enabling measurements in the circumferential directions at certain positions in the radial direction. Programming this enables continuous measurements.

Specifically, the measurements in the circumferential directions within a certain measurement range are possible by creating a program including: measuring in a circumferential direction of the template assembly→sliding in the radial direction→measuring in another circumferential direction→sliding in the radial direction, and so forth.

The measurement start position may be located at either the outer circumferential edge side or the inner circumferential edge side of the measurement range. Nevertheless, as shown in FIG. 3, the measurement start position is preferably located at the inner circumferential edge in view of precisely measuring the pocket depth 7. Specifically, the measurement start position is preferably at a position in the radial direction where the center of the laser width is positioned at the inner circumferential edge of the retainer ring 3. This enables a high precision measurement such that the back pad 2 near the retainer ring 3 is not in the blind spot for measuring data.

Moreover, the laser is preferably slid while overlapping with itself in a certain amount to prevent imperfect data acquisition and correct data. The circulating number N required for the measurement can be set freely in accordance with the size of the template assembly to be measured, and so forth.

The circulating number N required for the measurement in the entire region can be represented by an integer which satisfies an inequality shown by the following equation (1):

$$a+(N-1)\times(a-c)\geq a/2+b \quad (1)$$

where a represents a laser scanning width [mm]; b represents a distance [mm] from the outer circumferential edge of the base ring 5a (or base plate) to the inner circumferential edge of the retainer ring 3; and c represents a laser overlapping amount [mm].

For example, when the laser scanning width a is 6 [mm], the distance b from the outer circumferential edge of the base ring 5a (or base plate) to the inner circumferential edge of the retainer ring 3 is 40 [mm], and the laser overlapping amount c is 1 [mm], the circulating number N of required for the measurement in the entire region can be determined to be 9 according to the equation (1). The measurement is automatically performed by setting this number and pressing the measurement start button.

Then, a profile obtained by combining pieces of data corresponding to the circulating number N is subjected to leveling, given that the outer peripheral edge surface 6 of the base ring 5a (or base plate) serves as the reference surface. Then, for example, data as shown in FIG. 5 is outputted (height position distribution).

Next, a calculation step is performed in which a flatness of the retainer ring 3 and an average amount of step differences between the retainer ring 3 and the back pad 2 are calculated from the measured height position distribution (SP3 in FIG. 1). These calculation methods are not particularly limited, and can be selected on a case-by-case basis.

Figure 5:
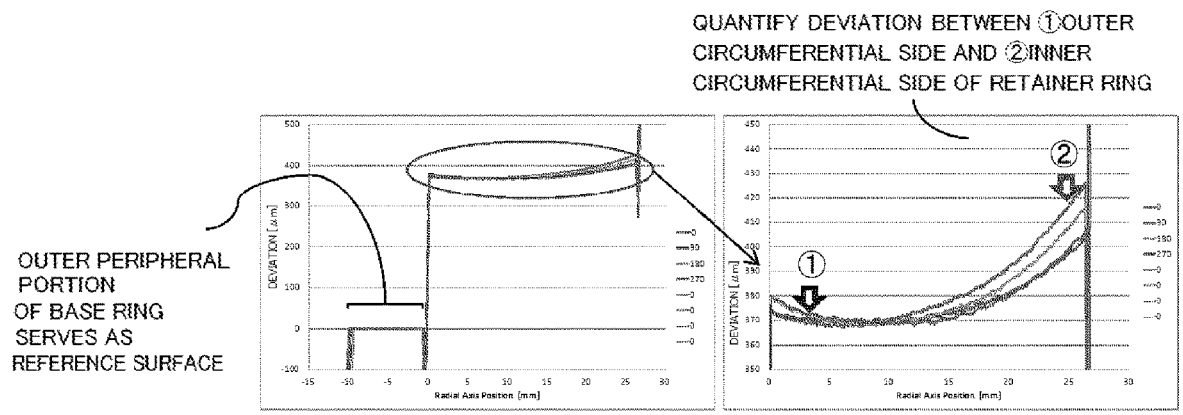
FIG. 5 is a graph showing an example of a height position distribution measured in the measurement step in the inventive method for selecting a template assembly.

The flatness of the retainer ring 3 can be quantified, for example, as shown in FIG. 5, by calculating a deviation between an average value obtained within several mm from an outer circumferential side of the retainer ring 3 and an average value obtained within several mm from an inner circumferential side of the retainer ring 3, and quantifying the deviation in terms of an average value of the data on each circumferential direction and the standard deviation. The calculation method is not limited thereto. For example, a difference between the maximum value and the minimum value in the height position distribution of the retainer ring can also be set as the flatness.

The average amount of step differences between the retainer ring 3 and the back pad 2 can be quantified, for example, by calculating a difference between the average value obtained within several mm from the inner circumferential side of the retainer ring 3 and an average value obtained within several mm inwardly of the inner circumferential edge of the retainer ring 3, that is, within a portion of the back pad 2, and quantifying the difference in terms of an average value of the data on each circumferential direction and the standard deviation.

The above data processing can quantify the average amount of step differences and the flatness in each template assembly. Moreover, the quantification for each template assembly can be carried out with high precision and high throughput.

Next, a selection step is performed in which a template assembly is selected based on the obtained flatness and average amount of step differences (SP4 in FIG. 1).

From the flatness and the average amount of step differences thus quantified, a template assembly can be selected by setting a certain criterion. Here, it is preferable to select template assemblies having the same numerical values of the flatness and the average amount of step differences quantified above.

To be more specific, preferably, a plurality of template assemblies are prepared in the preparation step (SP1), the measurement step (SP2) and the calculation step (SP3) are performed for each of the template assemblies, and from the plurality of template assemblies, template assemblies are selected which differ from each other in the flatness by 5 μm or less and differ from each other in the average amount of step differences by 5 μm or less. Note that, in this case, the difference in the flatness and the difference in the average amount of step differences can be 0 μm or more.

This particularly makes it possible to select template assemblies having sufficiently small variations in the flatness and the average amount of step differences from a plurality of template assemblies. Hence, when workpieces are polished using the template assemblies selected as described above, it is possible to more surely prevent a flatness variation of the polished workpieces, which thus can meet an increase in the tight-flatness requirement.

In this event, the plurality of template assemblies may be measured in advance to create a database tagged with ID. Then, the number N of template assemblies attached to a polishing machine is inputted, and the selection process can be performed with flatness Range≤5 μm and P.D. Range≤5 μm among the N template assemblies.

According to the inventive method for selecting a template assembly as described above, it is possible to measure the flatness of the retainer ring in addition to the average amount of step differences between the retainer ring and the back pad before the mounting onto a polishing head. Thus, the template assemblies can be selected based on the flatness and the average amount of step differences. Hence, when workpieces are polished using the template assemblies selected as described above, it is possible to particularly prevent a generation of a flatness variation of the polished workpieces. Further, performing the measurement step nondestructively makes it possible to prevent the retainer ring surface from being scratched and the polished workpieces from scratch.

Figure 6:
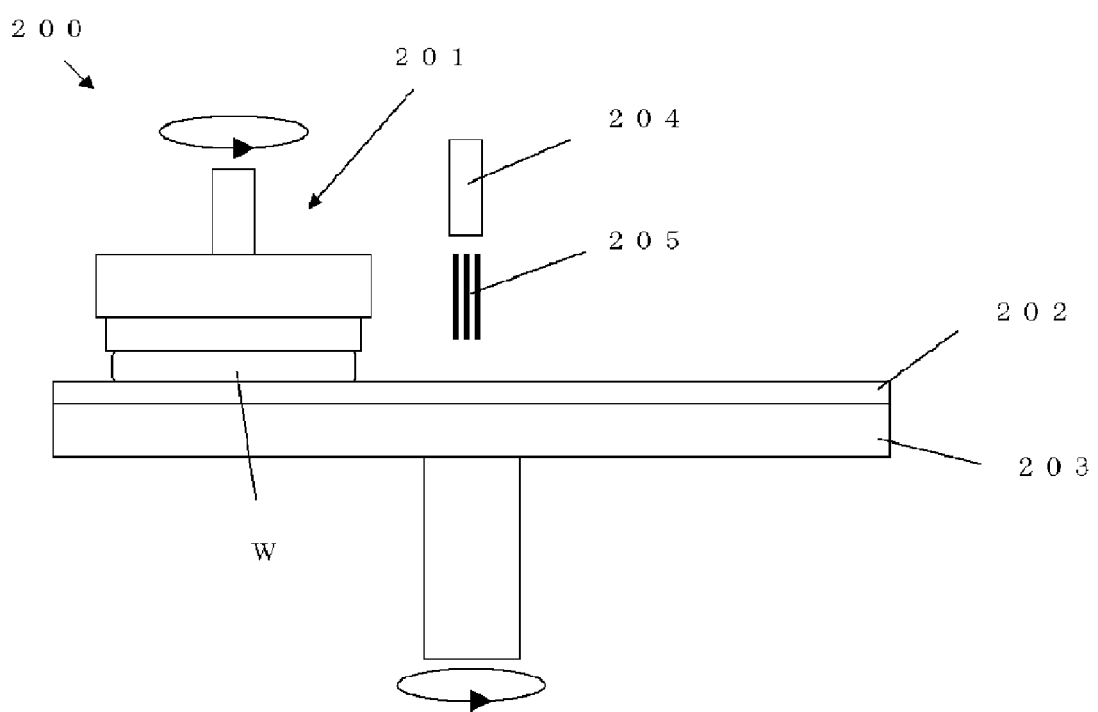
FIG. 6 is a schematic view showing an example of a polishing machine usable in the inventive method for polishing a workpiece.

Next, a method for polishing a workpiece of the present invention will be described. In this event, it is possible to use, for example, a polishing machine 200 as shown in FIG. 6. The polishing machine 200 includes a turntable 203 to which a polishing pad 202 is attached, a polishing agent supply mechanism 204, a polishing head 201 on which a template assembly selected as described above is mounted, and so forth.

In the polishing machine 200, the template assembly selected by the inventive method for selecting a template assembly as described above is mounted on the polishing head 201 to hold the workpiece W. Then, the polishing head 201 holds the workpiece W, and the polishing agent supply mechanism 204 supplies a polishing agent 205 onto the polishing pad 202, and the turntable 203 and the polishing head 201 are each rotated to rub the surface of the workpiece W against the polishing pad 202 so that the workpiece W can be polished.

In this manner, the template assembly selected by the inventive method for selecting a template assembly is used to polish the workpiece. This makes it possible to prevent a flatness variation of such polished workpieces.

EXAMPLES

Hereinafter, the present invention will be more specifically described with reference to Examples and Comparative Examples of the present invention, but the present invention is not limited thereto.

Example 1

As a polishing machine, the polishing machine 200 as shown in FIG. 6 was prepared to which four polishing heads 201 were provided. To put it differently, the number of template assemblies attached to the polishing machine is four. In addition, as workpieces, semiconductor Si wafers each having a diameter of 300 mm were used.

First, a template was prepared by thermocompression-bonding a retainer ring formed of a glass epoxy stacked layer plate having an outer diameter of 350 mm, an inner diameter of 301 mm, and a thickness of 700 μm (nominal values) on a back pad having an outer diameter of 350 mm and a thickness of 0.5 mm (nominal values) and made of a polyurethane resin using a thermal fusion adhesive. Note that the templates used in Example 1 and templates used in Comparative Examples 1 to 3 to be described later were all produced in the same lot.

Moreover, as the base, a base ring was prepared which had an outer diameter of 371 mm, an inner diameter of 310 mm, and a thickness of 20 mm and made of ceramic.

Then, the template was bonded onto the base ring using a double-sided tape such that the centers of the two were aligned with each other. Thus, a template assembly was prepared. In the same manner, 20 template assemblies were prepared in total.

Next, using the non-contact laser displacement gauge LJ-V7020 (manufactured by KEYENCE Corporation), a height position distribution of the retainer ring and the back pad on the template side of each template assembly was non-destructively measured, given that the outer peripheral edge surface of the base ring served as the reference surface.

Regarding this non-contact laser displacement gauge, the laser scanning width a was 8 mm, and the laser overlapping amount c was set to 0.5 mm. Since the inner diameter of the retainer ring was 301 mm and the outer diameter of the base ring was 371 mm, the distance b from the outer circumferential edge of the base ring to the inner circumferential edge of the retainer ring was 35 mm. Thus, the circulating number required for the measurement in the entire region was set to 6 according to the above-described equation (1). Moreover, each sampling period was set to 1°, and the data on the six-time were combined for each angle and respectively subjected to leveling, given that the outer peripheral edge surface of the base ring served as the reference surface.

Next, from the measured height position distribution, the flatness of the retainer ring and the average amount of step differences between the retainer ring and the back pad, that is, pocket depth (P.D.), were calculated.

A deviation between an average value obtained within 0.5 to 1.5 mm from the outer circumferential edge of the retainer ring and an average value obtained within 0.5 to 1.5 mm from the inner circumferential edge of the retainer ring was calculated, and such deviations were calculated along the circumferential direction (N=360). An average value of these deviations was obtained as the flatness of the retainer ring.

Regarding P.D. also, a difference between the average value obtained within 0.5 to 1 mm from the inner circumferential edge of the retainer ring and an average value obtained within 0.5 to 1 mm inwardly of the inner circumferential edge of the retainer ring, that is, within a portion of the back pad was calculated, and such differences were calculated along the circumferential direction (N=360). An average value of these differences was obtained as the P.D.

Next, four template assemblies were selected from the 20 template assemblies according to criteria of flatness Range≤5 μm and P.D. Range≤5 μm. Specifically, the four template assemblies chosen had a flatness variation of 5 μm or less and a P.D. variation of 5 μm or less. In this event, the time required for the measurement and selection was measured and shown in Table 1.

Next, the four template assemblies selected as described above were respectively mounted on the polishing heads 201 of the polishing machine 200 as shown in FIG. 6 to continuously polish a total of 100 workpieces of the semiconductor Si wafers having a diameter of 300 mm.

As the quality evaluation of the polished workpieces, the results of measuring flatness and scratch were shown in Table 2 together with those in Comparative Examples 1 to 3, which will be described later. In this event, as the flatness, ESFQRmax (1 mm E.Ex.) was measured by Wafersight (KLA-Tencor) M49 mode. As the scratch, SCR count was measured by Surfscan SP-1 ((KLA-Tencor) Normal mode.

Comparative Example 1

First, 20 template assemblies were prepared as in Example 1. Next, from the template assemblies, four template assemblies were randomly selected. In other words, no special pre-measurement was performed.

Next, workpieces were polished as in Example 1, except that the template assemblies selected in Comparative Example 1 were used. Then, the flatness and scratch of the polished workpieces were measured as in Example 1. Table 2 shows the result. Moreover, for the verification, the P.D. and flatness of the template assemblies were measured after the workpieces were polished. Table 1 shows the result.

Comparative Example 2

In Comparative Example 2, the selection was performed based on P.D. alone. First, 20 template assemblies were prepared as in Example 1.

Next, the P.D. of the template assemblies was manually measured using JA-205 manufactured by a low pressure micrometer manufactured by PEACOCK. Specifically, the thickness of an inner circumferential portion of each retainer ring and the thickness of the corresponding back pad near this measurement spot of the retainer ring in the same radial direction were measured. The difference value therebetween was calculated. Consequently, an average value of eight points in the respective 45° planes was obtained as the P.D. Then, four template assemblies were selected from the 20 template assemblies according to a criterion of P.D.

Range≤5 μm. In this event, the time required for the measurement and selection was measured and shown in Table 1.

Next, workpieces were polished as in Example 1, except that the template assemblies selected in Comparative Example 2 were used. Then, the flatness and scratch of the polished workpieces were measured as in Example 1. Table 2 shows the result. Moreover, the flatness of the template assemblies was measured after the workpieces were polished. Table 1 shows the result.

Comparative Example 3

In Comparative Example 3, the selection was performed based on P.D. and flatness. First, 20 template assemblies were prepared as in Example 1.

Next, the P.D. and flatness of the template assemblies were measured. The P.D. was measured as in Comparative Example 2. As to the flatness, eight lines in a plane were manually measured using SJ-400 manufactured by Mitutoyo Corporation as a contact-type profiler. A deviation between an average value obtained within 0.5 to 1.5 mm from the outer circumferential edge of each retainer ring and an average value obtained within 0.5 to 1.5 mm from the inner circumferential edge of the retainer ring was calculated at eight points in the planes for respective 45°. An average value of these deviations was obtained as the flatness.

Then, four template assemblies were selected from the 20 template assemblies according to criteria of P.D. Range≤5 μm and flatness Range≤5 μm. In this event, the time required for the measurement and selection was measured and shown in Table 1.

Next, workpieces were polished as in Example 1, except that the template assemblies selected in Comparative Example 3 were used. Then, the flatness and scratch of the polished workpieces were measured as in Example 1. Table 2 shows the result.

TABLE 1

| | Comparative Example 1 | Comparative Example 2 | Comparative Example 3 | Example 1 |
|---|---|---|---|---|
| Number N of TP ASSY | 4 | 4 | 4 | 4 |
| P.D. Range [μm] among N | 24.0 | 5.0 | 5.0 | 2.0 |
| Criterion ≤5 μm | NG | OK | OK | OK |
| Flatness Range [μm] among N | 23.0 | 25.0 | 5.0 | 4.0 |
| Criterion ≤5 μm | NG | NG | OK | OK |
| Whole number of TP ASSY | 20 | 20 | 20 | 20 |
| Measurement-selection time/one TP ASSY [min] | 0 | 3 | 12 | 1.5 |

As shown in Table 1, in Comparative Example 1 in which the selection based on P.D. and flatness was not performed, the P.D. Range was 24.0 μm and the flatness Range was 23.0 μm among the four template assemblies and both of which were outside the standard, although these measurement results were obtained after the polishing.

Meanwhile, it can be understood that Comparative Examples 2, 3 required longer times for the measurement and selection due to the time for the manual operations. On the other hand, Example enabled high-throughput measurement and selection for both parameters.

TABLE 2

| | | Comparative Example 1 | Comparative Example 2 | Comparative Example 3 | Example 1 |
|---|---|---|---|---|---|
| ESFQR Max [nm] | average | 54.17 | 46.55 | 42.47 | 40.87 |
| | sigma | 14.25 | 11.95 | 9.09 | 8.77 |
| SCR count [%] | | 0 | 0 | 20 | 0 |
| Number N of workpieces | | 100 | 100 | 100 | 100 |

As shown in Table 2, ESFQRmax was improved in Example 1 most for both the average value and σ. In Comparative Example 1, since no special pre-measurement was performed and the template assemblies were randomly selected, both the average value and σ of ESFQRmax were large. In Comparative Example 2, the selection was performed based on P.D. However, since the measurement targets were soft, the error in the measurement was large, and the variation improvement effect by the selection was small. Comparative Example 3 had numerical values of the average value and σ of ESFQRmax closer to those of Example 1 than those of the other Comparative Examples, but had many SCRs (scratches). This is due to dust generation by the contact-type profiler. If a retainer ring is scratched as in Comparative Example 3, problems occur particularly that, in the initial life of the polishing, the workpiece has SCR due to dust generation from a portion where the probe moved.

Examples 2 to 4, Comparative Examples 4 and 5

First, each template was prepared by thermocompression-bonding a retainer ring formed of a glass epoxy stacked layer plate having an outer diameter of 350 mm, an inner diameter of 301 mm, and a thickness of 700 μm (nominal values) on a back pad having an outer diameter of 350 mm and a thickness of 0.5 mm (nominal values) and made of a polyurethane resin using a thermal fusion adhesive. The retainer ring had a flatness of 15 μm.

Moreover, five types of base rings were prepared which had outer diameters larger than the outer diameter of the template by 20 mm (Example 2), 15 mm (Example 3), 10 mm (Example 4), 7.5 mm (Comparative Example 4), and 5 mm (Comparative Example 5). Note that all the base rings used had surface roughnesses Ra of 6.3 μm.

Then, the above-described templates were respectively combined with the base rings of Examples 2 to 4 and Comparative Examples 4 and 5. Given that the outer peripheral edge surface of each base ring served as the reference surface, the height position distribution of the retainer ring and the back pad was measured as in Example 1 to examine the measurement variation.

Figure 7:
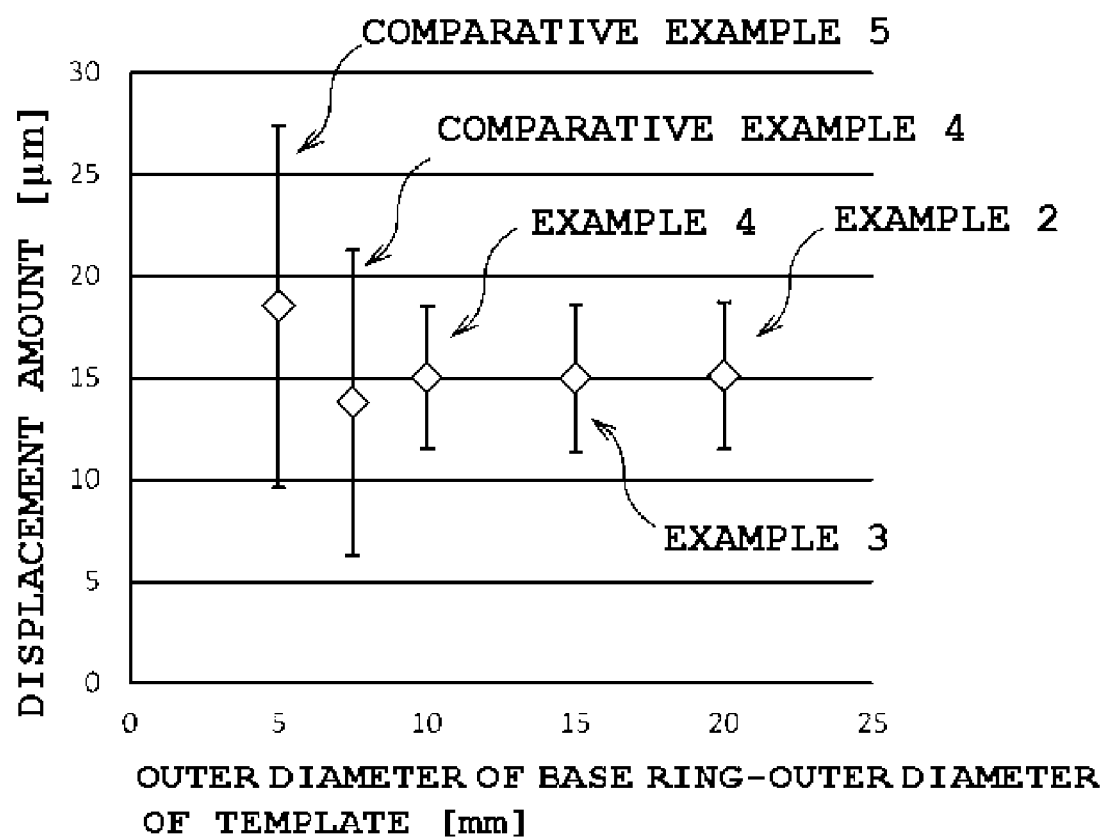
FIG. 7 is a graph showing a measurement variation obtained when the outer diameter of a base ring was changed.

Next, from the measured height position distribution, the flatness of the retainer ring was calculated as in Example 1. FIG. 7 and Table 3 show the result in this event.

TABLE 3

| | Example 2 | Example 3 | Example 4 | Comparative Example 4 | Comparative Example 5 |
|---|---|---|---|---|---|
| Base ring outer diameter - retainer ring outer diameter [mm] | 20 | 15 | 10 | 7.5 | 5 |

TABLE 3-continued

|  | Example 2 | Example 3 | Example 4 | Comparative Example 4 | Comparative Example 5 |
|---|---|---|---|---|---|
| Flatness ave. [μm] | 15.1 | 15 | 15 | 13.8 | 18.5 |
| Flatness sigma | 3.6 | 3.6 | 3.5 | 7.5 | 8.9 |

In all the cases, the outer circumferential portions of the base rings had the surface roughnesses Ra of 6.3 μm in the measurement Consequently, as shown in FIG. 7 and Table 3, in Examples 2 to 4 in each of which the outer diameter of the base ring was larger by at least 10 mm than that of the template, the flatness variation was small. Meanwhile, in Comparative Examples 4 and 5 in each of which the difference between the outer diameter of the base ring and the outer diameter of the template was less than 10 mm, the flatness variation was large.

Examples 5 to 7, Comparative Examples 6 and 7

First, the same templates as those prepared in Examples 2 to 4 and Comparative Examples 4 and 5 were prepared as described above. Moreover, five types of base rings were prepared which had surface roughnesses Ra of 10.5 μm (Comparative Example 6), 8.7 μm (Comparative Example 7), 6.3 μm (Example 5), 5.2 μm (Example 6), and 3.1 μm (Example 7). Note that the base rings used had larger outer diameters by 10 mm than those of the templates.

Then, the above templates were respectively combined with the base rings of Examples 5 to 7 and Comparative Examples 6 and 7. Given that the outer peripheral edge surface of each base ring served as the reference surface, the height position distribution of the retainer ring and the back pad was measured as in Example 1 to examine the measurement variation.

Figure 8:
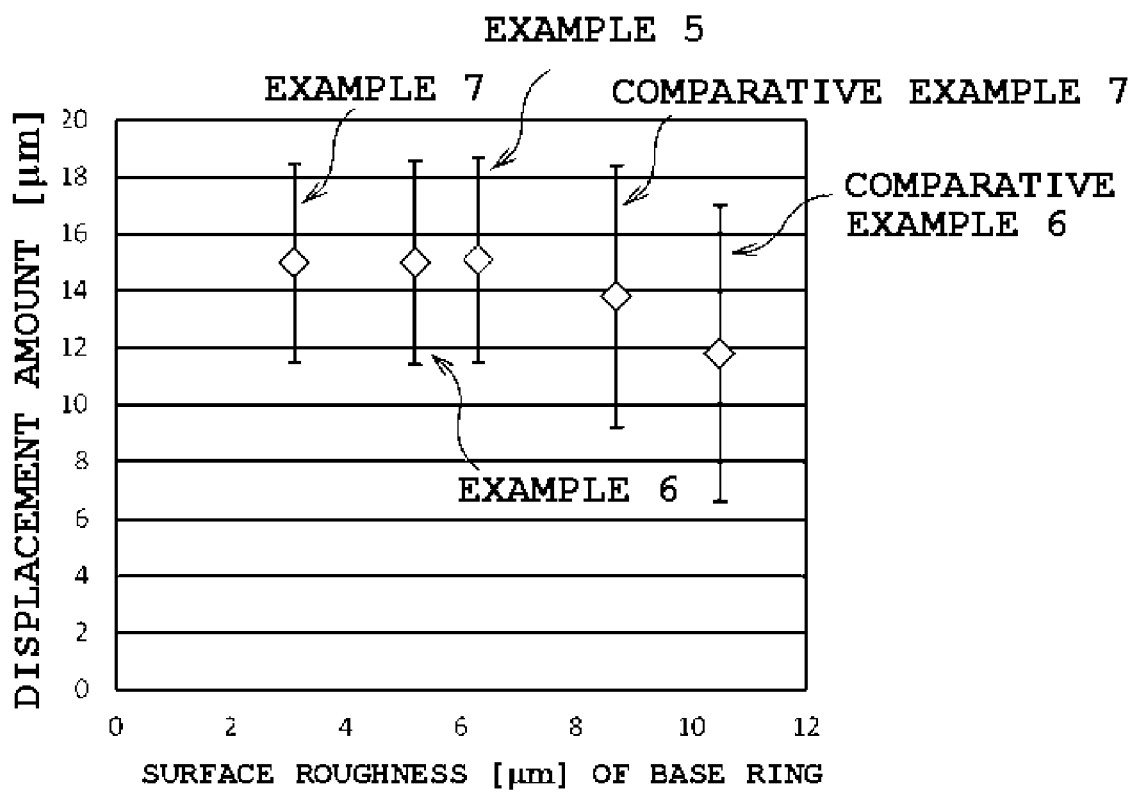
FIG. 8 is a graph showing a measurement variation obtained when the surface roughness of the base ring was changed.

Next, from the measured height position distribution, the flatness of the retainer ring was calculated as in Example 1. FIG. 8 and Table 4 show the result in this event.

TABLE 4

|  | Comparative Example 6 | Comparative Example 7 | Example 5 | Example 6 | Example 7 |
|---|---|---|---|---|---|
| Surface roughness [μm] of base ring outer circumferential portion | 10.5 | 8.7 | 6.3 | 5.2 | 3.1 |
| Flatness ave. [μm] | 11.8 | 13.8 | 15.1 | 15 | 15 |
| Flatness sigma | 5.2 | 4.6 | 3.6 | 3.6 | 3.5 |

In all the cases, the outer diameter of the base ring-the outer diameter of the template=10 mm in the measurement Consequently, as shown in FIG. 8 and Table 4, in Examples 5 to 7 in each of which the outer circumferential portion of the base ring had a surface roughness of 6.3 μm or less, the flatness variation was small. Meanwhile, in Comparative Examples 6 and 7 in each of which the outer circumferential portion of the base ring had a surface roughness of more than 6.3 μm, the flatness variation was large.

It should be noted that the present invention is not restricted to the above-described embodiments. The embodiments are merely examples so that any embodiments that have substantially the same feature and demonstrate the same functions and effects as those in the technical concept as disclosed in claims of the present invention are included in the technical range of the present invention.

The invention claimed is:

1. A method for selecting a template assembly to be mounted on a polishing head and used to hold a workpiece when a surface of the workpiece is polished by being rubbed against a polishing pad attached on a turntable, the method comprising:
    a preparation step of preparing a template assembly in which a template is concentrically attached on a base ring or a base plate having a larger outer diameter than that of the template, the template having a back pad configured to hold a back surface of the workpiece and a retainer ring positioned on the back pad and configured to hold an edge portion of the workpiece;
    a measurement step of non-destructively measuring a height position distribution of the retainer ring and the back pad on the template side of the template assembly, an outer peripheral edge surface of the base ring or the base plate serving as a reference surface;
    a calculation step of calculating a flatness of the retainer ring and an average amount of step differences between the retainer ring and the back pad from the measured height position distribution; and
    a selection step of selecting the template assembly based on the flatness and the average amount of step differences.

2. The method for selecting a template assembly according to claim 1, wherein the base ring or the base plate used has a larger outer diameter by at least 10 mm than that of the template and a surface roughness being Ra≤6.3 μm.

3. The method for selecting a template assembly according to claim 2, wherein, in the measurement step, measuring the height position distribution for each circumference of the template assembly by laser scanning in the circumferential direction using a laser displacement gauge and sliding the laser displacement gauge in a radial direction of the template assembly are alternately performed to measure the height position distribution of the retainer ring and the back pad at once.

4. The method for selecting a template assembly according to claim 3, wherein a plurality of the template assemblies are prepared in the preparation step,
    the measurement step and the calculation step are performed for each of the template assemblies, and
    from the plurality of template assemblies, template assemblies are selected which differ from each other in the flatness by 5 μm or less and differ from each other in the average amount of step differences by 5 μm or less.

5. A method for polishing a workpiece, comprising mounting the template assembly selected by the method for selecting a template assembly according to claim 4 on the polishing head to hold the workpiece for polishing.

6. A method for polishing a workpiece, comprising mounting the template assembly selected by the method for selecting a template assembly according to claim 3 on the polishing head to hold the workpiece for polishing.

7. The method for selecting a template assembly according to claim 2, wherein a plurality of the template assemblies are prepared in the preparation step,
    the measurement step and the calculation step are performed for each of the template assemblies, and
    from the plurality of template assemblies, template assemblies are selected which differ from each other in the flatness by 5 µm or less and differ from each other in the average amount of step differences by 5 µm or less.

8. A method for polishing a workpiece, comprising mounting the template assembly selected by the method for selecting a template assembly according to claim 7 on the polishing head to hold the workpiece for polishing.

9. A method for polishing a workpiece, comprising mounting the template assembly selected by the method for selecting a template assembly according to claim 2 on the polishing head to hold the workpiece for polishing.

10. The method for selecting a template assembly according to claim 1, wherein, in the measurement step, measuring the height position distribution for each circumference of the template assembly by laser scanning in the circumferential direction using a laser displacement gauge and sliding the laser displacement gauge in a radial direction of the template assembly are alternately performed to measure the height position distribution of the retainer ring and the back pad at once.

11. The method for selecting a template assembly according to claim 10, wherein a plurality of the template assemblies are prepared in the preparation step,
the measurement step and the calculation step are performed for each of the template assemblies, and
from the plurality of template assemblies, template assemblies are selected which differ from each other in the flatness by 5 µm or less and differ from each other in the average amount of step differences by 5 µm or less.

12. A method for polishing a workpiece, comprising mounting the template assembly selected by the method for selecting a template assembly according to claim 11 on the polishing head to hold the workpiece for polishing.

13. A method for polishing a workpiece, comprising mounting the template assembly selected by the method for selecting a template assembly according to claim 10 on the polishing head to hold the workpiece for polishing.

14. The method for selecting a template assembly according to claim 1, wherein a plurality of the template assemblies are prepared in the preparation step,
the measurement step and the calculation step are performed for each of the template assemblies, and
from the plurality of template assemblies, template assemblies are selected which differ from each other in the flatness by 5 µm or less and differ from each other in the average amount of step differences by 5 µm or less.

15. A method for polishing a workpiece, comprising mounting the template assembly selected by the method for selecting a template assembly according to claim 14 on the polishing head to hold the workpiece for polishing.

16. A method for polishing a workpiece, comprising mounting the template assembly selected by the method for selecting a template assembly according to claim 1 on the polishing head to hold the workpiece for polishing.

17. A template assembly to be mounted on a polishing head and used to hold a workpiece when a surface of the workpiece is polished by being rubbed against a polishing pad attached on a turntable, the template assembly comprising:
a template having a back pad configured to hold a back surface of the workpiece;
a retainer ring positioned on the back pad and configured to hold an edge portion of the workpiece; and
a base ring or a base plate having a larger outer diameter than that of the template,
wherein the template is concentrically attached on the base ring or the base plate,
the base ring or the base plate has a larger outer diameter by at least 10 mm than that of the template and a surface roughness being Ra≤6.3 µm, and
a part of the back pad is directly sandwiched between the retainer ring and the base ring or the base plate.

* * * * *